United States Patent [19]

O'Connell

[11] 4,224,548

[45] Sep. 23, 1980

[54] SINGLY ROTATED CUT OF Y-AXIS BOULE LEAD POTASSIUM NIOBATE, $PB_2KNB_5O_{15}$, FOR SURFACE ACOUSTIC WAVE APPLICATIONS

[75] Inventor: Robert M. O'Connell, Arlington, Mass.

[73] Assignee: The United States of America as represented by the Secretary of the Air Force, Washington, D.C.

[21] Appl. No.: 43,984

[22] Filed: May 31, 1979

[51] Int. Cl.² .......................................... H01L 41/18
[52] U.S. Cl. ................................. 310/360; 310/313 R
[58] Field of Search ............... 310/313, 360; 333/193, 333/150, 154

[56] References Cited

U.S. PATENT DOCUMENTS

| 4,001,767 | 1/1977 | Slobodnick, Jr. et al. .......... 310/360 |
| 4,109,172 | 8/1978 | O'Connell .......................... 310/313 |
| 4,109,173 | 8/1978 | O'Connell .......................... 310/313 |

OTHER PUBLICATIONS

Strong Electromechanical Coupling of SAW on a $Pb_2KNb_2O_{15}$ Single Crystal, by H. Yamauchi, Applied Physics Letters, vol. 32, #10, May 15, 1978.

Primary Examiner—Mark O. Budd
Attorney, Agent, or Firm—Joseph E. Rusz; William J. O'Brien

[57] ABSTRACT

A lead potassium niobate substrate having a Y-axis boule crystallographic orientation defined by the Euler Angles Lambda=90.0°, Mu=66.6° and Theta=0.0°.

1 Claim, 2 Drawing Figures ered cut of Y-axis boule lead
SINGLY ROTATED CUT OF Y-AXIS BOULE LEAD POTASSIUM NIOBATE, PB₂KNB₅O₁₅, FOR SURFACE ACOUSTIC WAVE APPLICATIONS

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave devices and to a substrate of lead potassium niobate, $Pb_2KNb_5O_{15}$, (PKN) for use therewith.

ST-cut quartz is often utilized as a piezoelectric substrate material for a wide variety of surface acoustic wave devices (SAW) such as filters, delay time encoders, decoders, correlators as well as other signal processing devices. Unfortunately, ST-cut quartz possesses a low piezoelectric coupling constant and, therefore, is not suitable for use in SAW devices designed to have low insertion losses and broad bandwidths. As a consequence, a considerable research effort has evolved in an attempt to find other materials for use as SAW substrates that are temperature compensated and possess a requisite high piezoelectric coupling constant. In attempting to find desirable materials, it was determined that, in order to be temperature compensated, the material often possesses either a positive temperature coefficient of an elastic constant or a negative coefficient of thermal expansion. That such a concept is valid has been demonstrated by the results of recent calculations of the SAW properties of berlinite (which has a positive temperature coefficient of an elastic constant) and $\beta$-eucryptite (which has a negative coefficient of thermal expansion). Those calculations showed that both materials are indeed temperature compensated and have larger piezoelectric coupling constants than ST-cut quartz.

However, berlinite and $\beta$-eucryptite still fail to possess as low a diffraction and as high piezoelectric constant as is desired for certain SAW applications. In further attempts at finding materials which might prove useful and desirable for SAW applications, it was discovered that lead potassium niobate (PKN), which occurs in the tungsten bronze structure and belongs to the orthorhombic crystal class $mm2(C_{2v})$ is attractive for SAW applications, when provided crystellographically oriented along the Y-axis in the manner, described herein. The most significant feature of this material is that its piezoelectric coupling constant is up to 16 times as large as that of ST-cut quartz, a material utilized heretofore for SAW devices. In addition, the diffraction spreading of PKN is less than that of an isotropic material, an attractive feature not shared by either quartz or berlinite. Calculations undertaken during the research effort have shown that a particular substrate of PKN having the Y-axis as the direction of propagation provides high piezoelectric coupling with a coupling constant 16 times as large as that of ST-cut quartz. The particular crystallographic orientation of this invention for a Y-axix boule orientation is defined by the Euler angle: Lambda=90.0°; Mu=66.6°; and Theta=0.0°.

Currently, lithium niobate (LiNbO₃) is used as a substrate material in surface acoustic wave devices requiring greater bandwidth (for a given amount of insertion loss) than that obtainable with ST cut quartz. But because LiNbO₃ has a large sensitivity to temperature, bulky and costly ovens are required for temperature control. This new orientation of PKN will extend to range of device bandwidths possible without having to resort to lithium niobate with its associated ovens and other temperature controlling schemes.

The most important feature of the crystallographic orientation of this invention is that its piezoelectric coupling coefficient is 16 times as large as that of ST-Cut quartz. This makes it possible to build low insertion-loss SAW devices with low temperature sensitivity and larger bandwidths than those obtainable in the devices currently being built on ST-cut quartz.

SUMMARY OF THE INVENTION

In accordance with the general concept of this invention it has been found that lead potassium niobate provides a desirable and efficient substrate material for surface acoustic wave (SAW) applications. Calculations of the SAW properties of the material have produced a Y-axis boule crystallographic orientation (the Y-axis of the crystal lies along the direction at propagation) with low diffraction and high piezoelectric coupling which makes it especially suitable for SAW applications. The advantages of using the substrate of this invention are achieved by the substrate having a crystallographic orientation which is defined by the Euler angle Lambda=90.0°, Mu=66.6° and Theta=0.0°.

Accordingly, the primary object object of this invention is to provide a novel substrate material for use in surface acoustic wave applications.

Another object of this invention is to provide a substrate material for surface acoustic wave applications that is characterized by a low diffraction loss.

Still another object of this invention is to provide a substrate material for surface wave acoustic wave applications that possesses very high piezoelectric coupling characteristics.

The above and still other objects and advantages of the present invention will become more readily apparent upon consideration of the following detailed description thereof when viewed in conjunction with the accompanying drawings.

DETAILED DESCRIPTION OF THE PREFERRED EMBODIMENT

Pursuant to the above-defined objects, it has been found that a lead potassium niobate crystalline substrate with a Y-axis boule crystallographic orientation defined by the Euler angle Lambda=90.0°, Mu=66.6° and Theta=0.0° is especially suitable for surface acoustic wave applications and exhibits a piezoelectric coupling constant of about 16 times as large as that of the previously known ST-cut quartz substrate.

Initial interst in PKN as a possible SAW substrate material was stimulated by measurements of its bulk wave properties which showed it to have electromechanical coupling factors as large as 0.73 and opposite signs for the temperature coefficients of the fundamental resonant frequencies for various crystal-cut plates.

Figure 2:
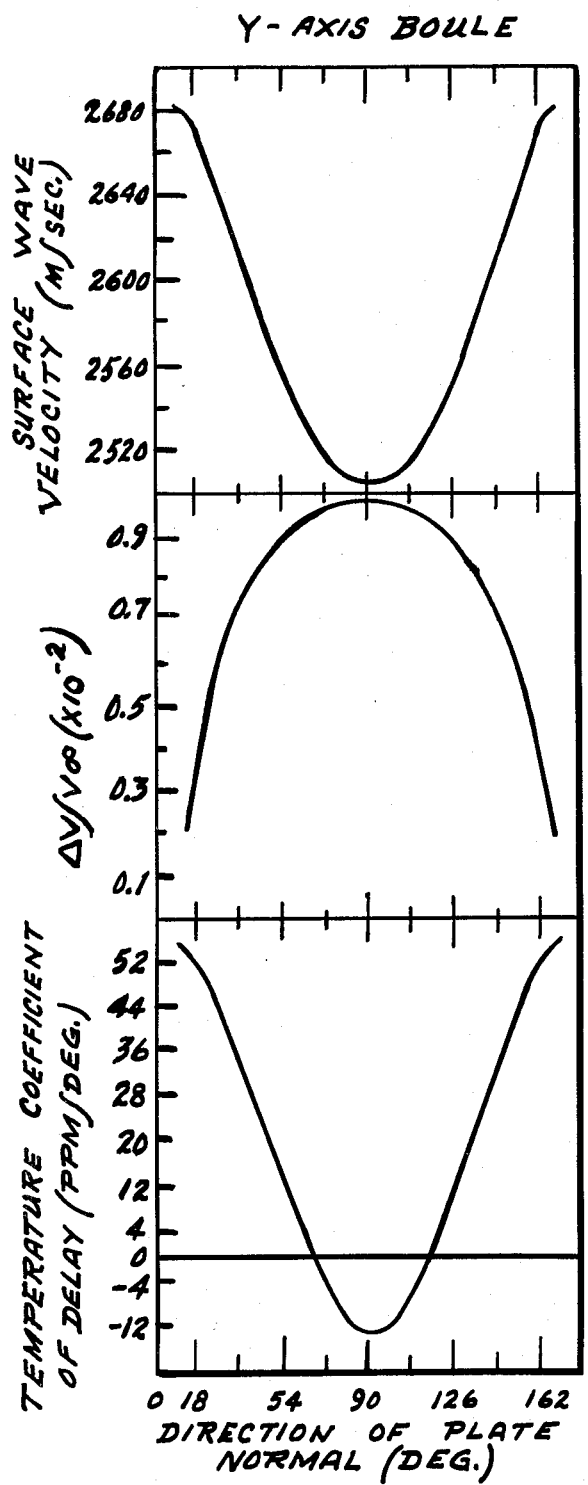
FIG. 2 is a graphical illustration showing various SAW properties for the Y-Axis boule of PKN shown in FIG. 1.

This latter result suggested that temperature-compensated cuts could be found for intermediate orientations.

in FIG. 2 of the electromechanical power flow angle since it is zero.

TABLE I

| Material | Orientation | Euler Angles | | | TCD (ppm/°C.) | Pow. Flow Ang.Θ (deg.) | Slp. of Power Flw. Angle ($\beta\phi/\beta\phi$) | $\Delta V/V_\infty$ x $10^{-2}$ | SAW Velocity (m/sec) |
| | | $\lambda$ | $\mu$ | $\Theta$ | | | | | |
| --- | --- | --- | --- | --- | --- | --- | --- | --- | --- |
| Lead potassium niobate ($Pb_2KNb_5O_{15}$) | Y-Axis Boule | 90 | 66.6 | 0 | 0.0 | 0.0 | −0.241 | 0.94 | 2525 |
| Quartz ($SiO_2$) | ST cut X-axis boule | 0 | 132.75 | 0 | 0.0 | 0.0 | 0.378 | 0.058 | 3158 |
| Berlinite $AlPO_4$) | boule 80.4° | 0 | 80.4 | 0 | 0.0 | 0.0 | 0.901 | 0.245 | 2751 |
| | Doubly rotated (110) | 79.7 | 90 | 15.5 | 0.0 | 0.0 | 0.221 | 0.247 | 2758 |
| Thallium vanadium sulfide ($Tl_3VS_4$) | cut 70° (110) | −45 | 90 | 70 | 0.0 | −17.0 | — | 1.0 | 900 |
| | cylinder 24° | 45 | 24 | 90 | 0.0 | 0.0 | — | 0.617 | 1010 |

Further impetus was provided by the results of measurements of the temperature coefficients of the elastic constants of PKN, some of which are positive. To investigate the SAW properties of PKN, a theoretical computer model was used to calculate the SAW velocity, the electromechanical power flow angle, an estimate of the piezoelectric coupling, and the first-order temperature coefficient of time delay for various singly rotated standard crystallographic orientation. As input, this model required experimental values for the elastic, piezoelectric, and dielectric constants, their respective temperature coefficients, the density, and the coefficients of thermal expansion. Values for all but one of these necessary constants were obtained from the data of Regnault, Ph.D. dissertation, (The Pennsylvania State University, 1977) (unpublished). His measurements were made on small (4-5 mm) single-crystal samples of PKN which were obtained from larger cracked boules grown from a melt by the conventional Czochralski method. The samples were homogeneous and free of internal strains but contained 180° (electrical) domains which adversely affected only the measurement of the dielectric constant; hence, for the SAW property calculations, a value for that quantity was obtained from the data of Yamada, J. Appl. Phys. 46, 2894 (1975). It should be noted that the effect of the dielectric constants on the SAW calculations is only second order in comparison to that of the elastic or piezoelectric constants.

Figure 1:
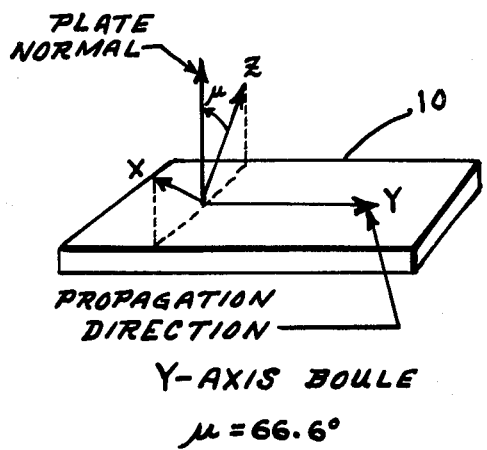
FIG. 1 is an isometric view illustrating the substrate member of PKN contemplated by this invention.

A Crystalline orientation considered attractive for SAW applications was found for a single rotation of the Y-axis boule. Plots of the SAW properties of the Y-axis boule are shown in FIG. 2 while FIG. 1 illustrates the lead potassium niobate substrate 10 of this invention with crystallographic axes and the Euler angles of this invention. The plotted curves of FIG. 2 show that there is an attractive and independent SAW orientation for the Y-axis boule. THE orientation is listed in Table I with values for the temperature coefficient of time delay (TCD), piezoelectric coupling constant ($\Delta V/V_\infty$), and SAW velocity. For comparison, the ST cut of quartz, two recently reported SAW orientations of berlinite, $AlPO_4$, and two of thallium vanadium sulfide, $Tl_3VS_4$, are included also. There is no illustration As the data in Table I shows, this new orientation of PKN possesses the desirable combination of a small TCD and a zero electromechanical power flow angle. Most significant, however, is the fact that the piezoelectric coupling constant of this orientation is almost 16 times as large as that of ST cut quartz. It is known that, for a given amount of insertion loss, the maximum attainable fractional bandwidth of a SAW device is proportional to the square root of the $\Delta V/V_\infty$ coupling constant; hence, the large coupling of PKN makes feasible the development of temperature-compensated SAW devices with up to four times the fractional bandwidth possible with ST-cut quartz, for an equal amount of insertion loss. It can be seen from FIG. 2 that there is a series of orientations whose piezoelectric coupling constants decrease only slightly from 0.0099 as the Euler angle $\mu$ is varied plus or minus 23.4° from 90.0°.

Another attractive feature illustrated by Table I is that the slope of the electromechanical power flow angle ($2\phi/2\phi$) lies between 0.0 and −1.0. According to SAW diffraction theory, the diffraction spreading for this orientation is less than that of an isotropic material. This is another distinct advantage of PKN over either quartz or berlinite.

As is the case with any new material, precise determination of the crystallographic orientation possessing the attractive combination of SAW properties discussed above awaits the availability of abundant supplies of larger single-crystal samples of PKN. Currently, a cracking problem, which occurs during the growth process, limits single crystals to dimensions of only several millimeters. Solution of this cracking problem will make it possible to obtain a more reliable set of material constants, calculate the temperature-compensated orientations more accurately, and construct devices to experimentally verify those calculations. Despite the need for greater accuracy in the locations of the temperature-compensated orientations, however, the data presented herein show clearly that the PKN substrate of this invention will make feasible the development of temperature-stable low-insertion-loss SAW devices with far broader bandwidth than that possible with quartz, and without the temperature control schemes necessary with lithium niobate.

While the invention has been described by reference to a particular embodiment, it should be understood that those modifications as encompassed within the scope of the appended claims are intended to be included herein.

What is claimed is:

1. A lead potassium niobate crystalline substrate member particularly adapted for use in surface acoustic wave device which is characterized by having an acoustic wave propagation surface defined by a plane that substantially coincides with the Euler angles Lambda=90.0°, Mu=66.6 and Theta=0.0°.

* * * * *